(12) United States Patent
Kwak et al.

(10) Patent No.: US 10,861,515 B2
(45) Date of Patent: Dec. 8, 2020

(54) SEMICONDUCTOR MEMORY DEVICE FOR RESETTING COUNTER SYNCHRONIZED WITH DATA CLOCK BY USING RESET SIGNAL SYNCHRONIZED WITH SYSTEM CLOCK AND METHOD FOR OPERATING THE SAME

(71) Applicant: SK hynix Inc., Gyeonggi-do (KR)

(72) Inventors: Kang-Sub Kwak, Gyeongsangnam-do (KR); Sang-Sic Yoon, Gyeonggi-do (KR); Young-Jun Yoon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/128,803

(22) Filed: Sep. 12, 2018

(65) Prior Publication Data

US 2019/0311752 A1     Oct. 10, 2019

(30) Foreign Application Priority Data

Apr. 6, 2018   (KR) .................. 10-2018-0040550

(51) Int. Cl.
*G11C 7/22*      (2006.01)
*G11C 11/34*     (2006.01)
*G11C 7/10*      (2006.01)

(52) U.S. Cl.
CPC .............. *G11C 7/222* (2013.01); *G11C 7/109* (2013.01); *G11C 7/1093* (2013.01); *G11C 7/225* (2013.01); *G11C 11/34* (2013.01)

(58) Field of Classification Search
None
See application file for complete search history.

(56) References Cited

U.S. PATENT DOCUMENTS

| 5,487,092 | A | * | 1/1996 | Finney | ...................... | H04L 7/02 |
| | | | | | | 375/354 |
| 6,029,250 | A | * | 2/2000 | Keeth | ....................... | G06F 5/06 |
| | | | | | | 711/167 |
| 2009/0168546 | A1 | * | 7/2009 | Kim | ...................... | G11C 7/1051 |
| | | | | | | 365/189.05 |
| 2009/0222707 | A1 | * | 9/2009 | Shin | ..................... | G06F 11/1004 |
| | | | | | | 714/758 |
| 2009/0222713 | A1 | * | 9/2009 | Shin | ..................... | G06F 11/1004 |
| | | | | | | 714/807 |
| 2010/0054073 | A1 | * | 3/2010 | Park | ..................... | G11C 7/1072 |
| | | | | | | 365/233.1 |
| 2017/0004869 | A1 | * | 1/2017 | Shin | .................... | G11C 11/4096 |

FOREIGN PATENT DOCUMENTS

| KR | 100942950 | 2/2010 |
| KR | 1020170088765 | 8/2017 |

* cited by examiner

*Primary Examiner* — J. H. Hur
(74) *Attorney, Agent, or Firm* — IP & T Group LLP

(57) ABSTRACT

An operating method for a semiconductor memory device includes: generating a whole-domain-crossing-unit reset signal based on a domain-crossing-unit reset signal input to a whole-domain-crossing-unit-reset-signal generator; and resetting a counter synchronized to a data clock of a domain-crossing unit based on the whole-domain-crossing-unit reset signal during a data clock preparation section in which the data clock does not toggle.

20 Claims, 12 Drawing Sheets

SEMICONDUCTOR MEMORY DEVICE FOR RESETTING COUNTER SYNCHRONIZED WITH DATA CLOCK BY USING RESET SIGNAL SYNCHRONIZED WITH SYSTEM CLOCK AND METHOD FOR OPERATING THE SAME

CROSS-REFERENCE TO RELATED APPLICATIONS

The present application claims priority of Korean Patent Application No. 10-2018-0040550, filed on Apr. 6, 2018, which is incorporated herein by reference in its entirety.

BACKGROUND

1. Field

Exemplary embodiments of the present invention relate to a semiconductor memory device, and more particularly a synchronous semiconductor memory device.

2. Description of the Related Art

Semiconductor memory devices are being developed to increase the degree of integration and the operating speeds of the semiconductor memory devices. In order to increase the operating speeds of the semiconductor memory devices, a synchronous memory device has been developed. This synchronous memory device is capable of operating in synchronization with a clock signal received from outside a memory chip. A single data rate (SDR) synchronous semiconductor memory device was proposed to input or output one piece of the data through a single data pin during a single period of an external clock, particularly in synchronization with a rising edge of the external clock. However, the SDR synchronous semiconductor memory device is insufficient for a system required to operate at higher speed.

In detail, a semiconductor memory device outputs, in response to a read command provided from a data processing apparatus such as a memory controller, read data corresponding to a read address provided along with the read command from the data processing apparatus. Also, a semiconductor memory device stores, in response to a write command provided from the data processing apparatus, write data corresponding to a write address provided along with the write command from the data processing apparatus. Such read and write operations of the semiconductor memory device are required to be operated at a high speed.

In general, performance of a semiconductor memory device is evaluated as good as the speeds of the read and write operations thereof become faster. Particularly, the time required to output stored data is an important evaluation factor for a semiconductor memory device which processes a great amount of data such as an image data. Further, a system may stably operate when a semiconductor memory device outputs precise data to the system.

A semiconductor memory device is proposed to input or output two bits of data at rising and falling edges of an externally provided system clock for higher data input and output. That is, the semiconductor memory device inputs or outputs four bits of data during a single period of the system clock. For the input and output of four bits of data during a single period of the system clock, the semiconductor memory device uses a data clock having a frequency twice greater than the system clock.

That is, the semiconductor memory device uses the system clock for the reception of addresses and commands from external sources and uses the data clock for input and output of the four-bit data in a single period of the system clock.

A domain crossing unit is required to change read and write signals synchronized to the system clock to be synchronized to the data clock.

The domain crossing unit includes a counter synchronized to the system clock and a counter synchronized to the data clock.

For the normal operation of the domain crossing unit, required is an operation of resetting the counter synchronized to the system clock and the counter synchronized to the data clock.

SUMMARY

Various embodiments are directed to a method of efficiently resetting a counter of a domain crossing unit, especially a counter synchronized to a data clock.

In an exemplary embodiment of the present invention, an operating method for a semiconductor memory device may include: generating a whole-domain-crossing-unit reset signal based on a domain-crossing-unit reset signal input to a whole-domain-crossing-unit-reset-signal generator; and resetting a counter synchronized to a data clock of a domain-crossing unit based on the whole-domain-crossing-unit reset signal during a data clock preparation section in which the data clock does not toggle.

The generating of the whole-domain-crossing-unit reset signal includes generating the whole-domain-crossing-unit reset signal, which is the same as the domain-crossing-unit reset signal, when the domain-crossing-unit reset signal falls in the data clock preparation section.

The generating of the whole-domain-crossing-unit reset signal includes generating the whole-domain-crossing-unit reset signal, which falls in the data clock preparation section, by delaying the domain-crossing-unit reset signal by a predetermined amount of time when the domain-crossing-unit reset signal does not fall in the data clock preparation section.

The method may further include generating a data clock by dividing a pre-data clock signal output from a data clock input buffer.

The generating of the data clock includes dividing the pre-data clock signal based on a ratio of frequencies of the data clock and the system clock so that frequencies of the data clock and the system clock are the same as each other.

The generating of the data clock may include: a first step of generating a second pre-data clock signal by dividing the pre-data clock signal through a first divider; a second step of generating a third pre-data clock signal by dividing the second pre-data clock signal through a second divider; and a third step of generating the data clock by selecting one between the second pre-data clock signal and the third pre-data clock signal.

The third step generates the data clock by selecting the data clock signal having the same frequency as the system clock based on a ratio of frequencies of the data clock and the system clock.

The method may further include: generating a first data-clock-synchronized read/write signal based on a data clock having a non-inverted phase; and generating a second data-clock-synchronized read/write signal based on a data clock having an inverted phase.

The method may further include generating, by a phase detector, a phase detection information signal representing phase information of the data clock based on the pre-data clock.

The method may further include selecting and outputting, by a phase selector, one between the first data-clock-synchronized read/write signal and the second data-clock-synchronized read/write signal based on the phase detection information signal.

In an exemplary embodiment of the present invention, a semiconductor memory device may include: a domain-crossing unit; and a whole-domain-crossing-unit-reset-signal generator suitable for generating a whole-domain-crossing-unit reset signal based on a domain-crossing-unit reset signal, wherein the domain-crossing unit resets a counter synchronized to a data clock of the domain-crossing unit based on the whole-domain-crossing-unit reset signal during a data clock preparation section in which the data clock does not toggle.

The whole-domain-crossing-unit-reset-signal generator generates the whole-domain-crossing-unit reset signal, which is the same as the domain-crossing-unit reset signal, when the domain-crossing-unit reset signal falls in the data clock preparation section.

The whole-domain-crossing-unit-reset-signal generator generates the whole-domain-crossing-unit reset signal, which falls in the data clock preparation section, by delaying the domain-crossing-unit reset signal by a predetermined amount of time when the domain-crossing-unit reset signal does not fall in the data clock preparation section.

The semiconductor memory device may further include a divider suitable for generating a data clock by dividing a pre-data clock signal output from a data clock input buffer.

The divider divides the pre-data clock signal based on a ratio of frequencies of the data clock and the system clock so that frequencies of the data clock and the system clock are the same as each other.

The divider may include: a first divider suitable for generating a second pre-data clock signal by dividing the pre-data clock signal through the first divider; a second divider suitable for generating a third pre-data clock signal by dividing the second pre-data clock signal through the second divider; and a data clock frequency selector suitable for generating the data clock by selecting one between the second pre-data clock signal and the third pre-data clock signal.

The data clock frequency selector generates the data clock by selecting the data clock signal having the same frequency as the system clock based on a ratio of frequencies of the data clock and the system clock.

The domain-crossing unit may include: a first domain-crossing unit suitable for generating a first data-clock-synchronized read/write signal based on a data clock having a non-inverted phase; and a second domain-crossing unit suitable for generating a second data-clock-synchronized read/write signal based on a data clock having an inverted phase.

The semiconductor memory device may further include a phase detector suitable for generating a phase detection information signal representing phase information of the data clock based on the pre-data clock.

The semiconductor memory device may further include a phase selector suitable for selecting and outputting one of the first data-clock-synchronized read/write signal and the second data-clock-synchronized read/write signal based on the phase detection information signal.

In accordance with an embodiment of the present disclosure, a counter synchronized to a data clock may be reset without a CLK-WCK unstableness prevention unit. Therefore, a space may be reduced as the CLK-WCK unstableness prevention unit is removed. Also, power consumption due to the CLK-WCK unstableness prevention unit may be reduced.

In accordance with an embodiment of the present disclosure, the time to reset a domain crossing unit may be reduced and the reduced amount of time may be reserved for other operations.

In an exemplary embodiment of the present invention, a semiconductor memory device may include: a command input circuit suitable for generating a domain-crossing-unit reset signal; a whole-domain-crossing-circuit-reset-signal generator suitable for generating a whole-domain-crossing-unit reset signal in response to the domain-crossing-unit reset signal; and a domain-crossing circuit suitable for generating a data-clock-synchronized read/write signal based on a data clock and the whole-domain-crossing-unit reset signal, wherein the domain-crossing circuit includes a counter and resets the counter synchronized to the data clock based on the whole-domain-crossing-unit reset signal during a data clock preparation section in which the data clock does not toggle.

DETAILED DESCRIPTION

Figure 1:
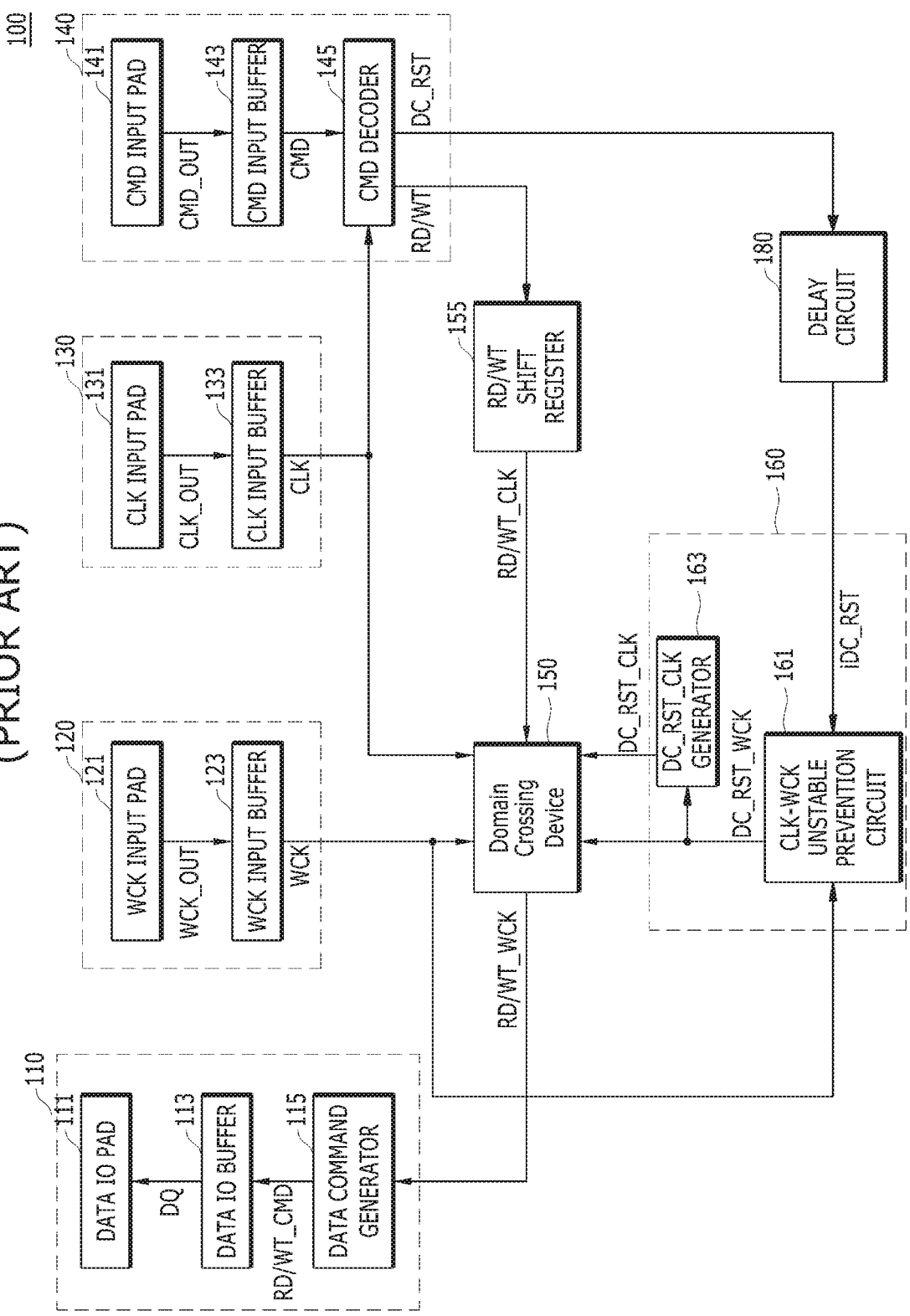
FIG. 1 is a block diagram schematically illustrating a semiconductor memory device according to conventional art.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete and will fully convey the scope of the present invention to those skilled in the art. The drawings are not necessarily to scale and in some instances, proportions may have been exaggerated in order to clearly illustrate features of the embodiments. Throughout the disclosure, reference numerals correspond directly to the like parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween. When a first layer is referred to as being "on" a second layer or "on" a substrate, it not only refers to a case where the first layer is formed directly on the second layer or the substrate but also a case where a third layer exists between the first layer and the second layer or the substrate.

The term "or" as used herein means either one of two or more alternatives but not both nor any combinations thereof.

It will be further understood that the terms "includes," and "including" are used interchangeably in this specification with the open-ended terms "comprises," and "comprising," to specify the presence of any stated elements and do not preclude the presence or addition of one or more other non-stated elements.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art, and should not be interpreted in an idealized or overly formal sense unless expressly so defined herein.

In the following description, numerous specific details are set forth in order to provide a thorough understanding of the present invention. The present invention may be practiced without some or all of these specific details.

FIG. 1 is a block diagram schematically illustrating a semiconductor memory device 100 performing a domain-crossing operation according to conventional art.

Referring to FIG. 1, the semiconductor memory device 100 includes a data input/output (IO) unit 110, a data clock input unit 120, a system clock input unit 130, a command input unit 140, a domain-crossing unit 150, a read/write shift register 155 and a CLK-WCK unstableness prevention unit 160.

Through a data JO pad 111, the data IO unit 110 outputs internal data to an external of the semiconductor memory device 100 and receives external data provided from an external of the semiconductor memory device 100 into the semiconductor memory device 100. Figures of this disclosure are provided according to situation where data DQ is output.

Through a data clock IO pad 121, the data clock input unit 120 receives an external data clock WCK_OUT provided from an external. A clock input buffer 123 included in the data clock input unit 120 generates a data clock WCK by amplifying the external data clock WCK_OUT.

Through a system clock input pad 131, the system clock input unit 130 receives an external system clock CLK_OUT provided from an external source. A system clock input buffer 133 included in the system clock input unit 130 generates a system clock CLK by amplifying the external system clock CLK_OUT.

Through a command input pad 141, the command input unit 140 receives an external command CMD_OUT provided from an external source. A command input buffer 143 included in the command input unit 140 generates a command CMD by amplifying the external command CMD_OUT.

A command decoder 145 included in the command input unit 140 generates a read/write signal RD/WT and a first domain-crossing-unit reset signal DC_RST based on the command CMD.

The read/write shift register 155 generates a system-clock-synchronized read/write signal RD/WT_CLK, which is synchronized to the system clock CLK, based on the read/write signal RD/WT. Since the read/write signal RD/WT is generated on the basis of the system clock CLK, the read/write shift register 155 generates the system-clock-synchronized read/write signal RD/WT_CLK from the read/write signal RD/WT.

The first domain-crossing-unit reset signal DC_RST is generated on the basis of the system clock CLK. Since the first domain-crossing-unit reset signal DC_RST is synchronized to the system clock CLK, the first domain-crossing-unit reset signal DC_RST itself cannot be used for resetting a counter synchronized to the data clock WCK, since the counter is included in the domain-crossing unit 150.

In order to solve the above described problem, the CLK-WCK unstableness prevention unit 160 generates a signal for resetting the counter synchronized to the data clock WCK through a CLK-WCK unstableness prevention circuit 161, and generates a signal for resetting a counter synchronized to the system clock CLK through a system-clock-synchronized-domain-crossing-unit-reset-signal generator 163.

The CLK-WCK unstableness prevention circuit 161 generates a data-clock-synchronized-domain-crossing-unit reset signal DC_RST_WCK, which is synchronized to the data clock WCK of the domain-crossing unit 150, based on a second domain-crossing-unit reset signal iDC_RST and the data clock WCK.

The command decoder 145 may provide the first domain-crossing-unit reset signal DC_RST to Delay Circuit (180). The delay Circuit (180) may provide the second domain-crossing-unit reset signal iDC_RST to the CLK-WCK unstableness prevention unit 160 by delaying the signal of the first domain-crossing-unit reset signal DC_RST by an amount of 'tD'.

The system-clock-synchronized-domain-crossing-unit-reset-signal generator 163 generates a system-clock-synchronized-domain-crossing-unit reset signal DC_RST_CLK based on the data-clock-synchronized-domain-crossing-unit reset signal DC_RST_WCK. In detail, the system-clock-synchronized-domain-crossing-unit-reset-signal generator 163 generates the system-clock-synchronized-domain-crossing-unit reset signal DC_RST_CLK by delaying the data-clock-synchronized-domain-crossing-unit reset signal DC_RST_WCK by the amount of 'tD'.

The domain-crossing unit 150 initializes a counter synchronized to the data clock WCK thereof and a counter synchronized to the system clock CLK thereof respectively based on the data-clock-synchronized-domain-crossing-unit reset signal DC_RST_WCK and the system-clock-synchronized-domain-crossing-unit reset signal DC_RST_CLK.

The domain-crossing unit 150 outputs the system-clock-synchronized read/write signal RD/WT_CLK to a data command generator 115.

The data command generator 115 generates and outputs a read/write command signal RD/WT_CMD to a data IO buffer 113.

The data IO buffer 113 outputs data DQ through the data IO pad 111.

Figure 2:
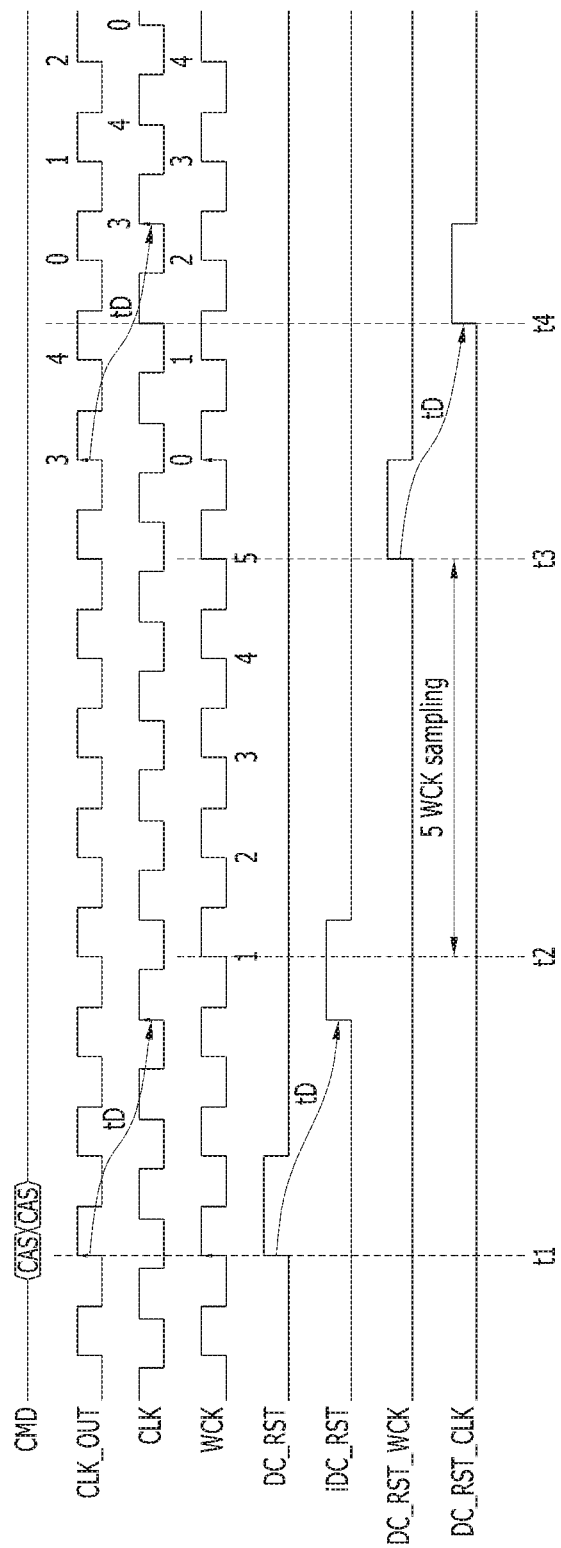
FIG. 2 is a timing diagram illustrating signals of the semiconductor memory device of FIG. 1.

FIG. 2 is a timing diagram illustrating signals of the semiconductor memory device 100 of FIG. 1.

It is assumed that the domain-crossing unit 150 is operative according to the system clock CLK and the data clock WCK having the same frequency as each other.

After the external system clock CLK_OUT is input to the system clock input buffer 133 through the system clock input pad 131 at a time point 't1', the system clock CLK is output from the system clock input buffer 133 and input to the domain-crossing unit 150 after an amount of time 'tD'.

In the same way, the first domain-crossing-unit reset signal DC_RST is output from the command decoder 145 at a time point 't1' and it takes the amount of time 'tD' for the first domain-crossing-unit reset signal DC_RST to reach the CLK-WCK unstableness prevention circuit 161 at a time point 't2'.

The second domain-crossing-unit reset signal iDC_RST is a delayed signal of the first domain-crossing-unit reset signal DC_RST by the amount of time 'tD'.

The second domain-crossing-unit reset signal iDC_RST is synchronized to the system clock CLK as the same as the first domain-crossing-unit reset signal DC_RST, and thus the second domain-crossing-unit reset signal iDC_RST itself cannot be used for resetting a counter synchronized to the data clock WCK, the counter being included in the domain-crossing unit 150.

The CLK-WCK unstableness prevention circuit 161 changes the second domain-crossing-unit reset signal iDC_RST to the data-clock-synchronized-domain-crossing-unit reset signal DC_RST_WCK during five cycles of the data clock WCK (5 WCK sampling) between the time points 't2' and 't3'.

As illustrated in FIG. 2, the data-clock-synchronized-domain-crossing-unit reset signal DC_RST_WCK is synchronized to the data clock WCK at the time point 't3'.

Also, the system-clock-synchronized-domain-crossing-unit-reset-signal generator 163 generates the system-clock-synchronized-domain-crossing-unit reset signal DC_RST_CLK by delaying the data-clock-synchronized-domain-crossing-unit reset signal DC_RST_WCK by the amount of 'tD'.

As illustrated in FIG. 2, the system-clock-synchronized-domain-crossing-unit reset signal DC_RST_CLK is synchronized to the system clock CLK at the time point 't4'.

The domain-crossing unit 150 initializes the counter synchronized to the data clock WCK thereof and the counter synchronized to the system clock CLK thereof respectively based on the data-clock-synchronized-domain-crossing-unit reset signal DC_RST_WCK and the system-clock-synchronized-domain-crossing-unit reset signal DC_RST_CLK.

The domain-crossing unit 150 initializes the counter synchronized to the data clock WCK and included therein based on the data-clock-synchronized-domain-crossing-unit reset signal DC_RST_WCK.

In the same way, the domain-crossing unit 150 initializes the counter synchronized to the system clock CLK and included therein based on the system-clock-synchronized-domain-crossing-unit reset signal DC_RST_CLK.

The problem of the domain crossing operation according to conventional art illustrated with reference to FIGS. 1 and 2 is as follows.

The CLK-WCK unstableness prevention unit 160 is required for the domain-crossing unit 150 and a space is required for the CLK-WCK unstableness prevention unit 160.

Also, it takes an additional time for the CLK-WCK unstableness prevention unit 160 to operate.

Further, it is required to perform a CLK-WCK training operation at least once for resetting the domain-crossing unit 150. During the CLK-WCK training operation, a timing between the system clock CLK and the data clock WCK is matched by adjusting a skew between the system clock CLK and the data clock WCK.

The above described problem may be more serious to the semiconductor memory device included in a mobile apparatus. One of the most important issues in the field of a semiconductor memory device being included in a mobile apparatus is to reduce power consumption. Therefore, while the semiconductor memory device is idle, the data clock WCK may not be provided to the semiconductor memory device. In this case, the semiconductor memory device may stop the operation of the data clock input buffer 123 thereby reducing the power consumption.

When the data clock WCK is resumed to be provided again after the stop of the data clock input buffer 123, the semiconductor memory device cannot immediately change the data clock WCK into a toggle status. An amount of time is required for the semiconductor memory device to get ready for receiving the data clock WCK. Such amount of time is referred to as the data clock preparation section tWCK_PRE_STATIC, which is defined in the standard of the low power DDR5 (LPDDR5).

In accordance with an embodiment of the present disclosure, provided is an operation method for resetting the domain-crossing unit by utilizing the data clock preparation section tWCK_PRE_STATIC.

In accordance with an embodiment of the present disclosure, the second domain-crossing-unit reset signal iDC_RST may be utilized for resetting both of the counter synchronized to the data clock WCK and the counter synchronized to the system clock CLK.

Figure 3:
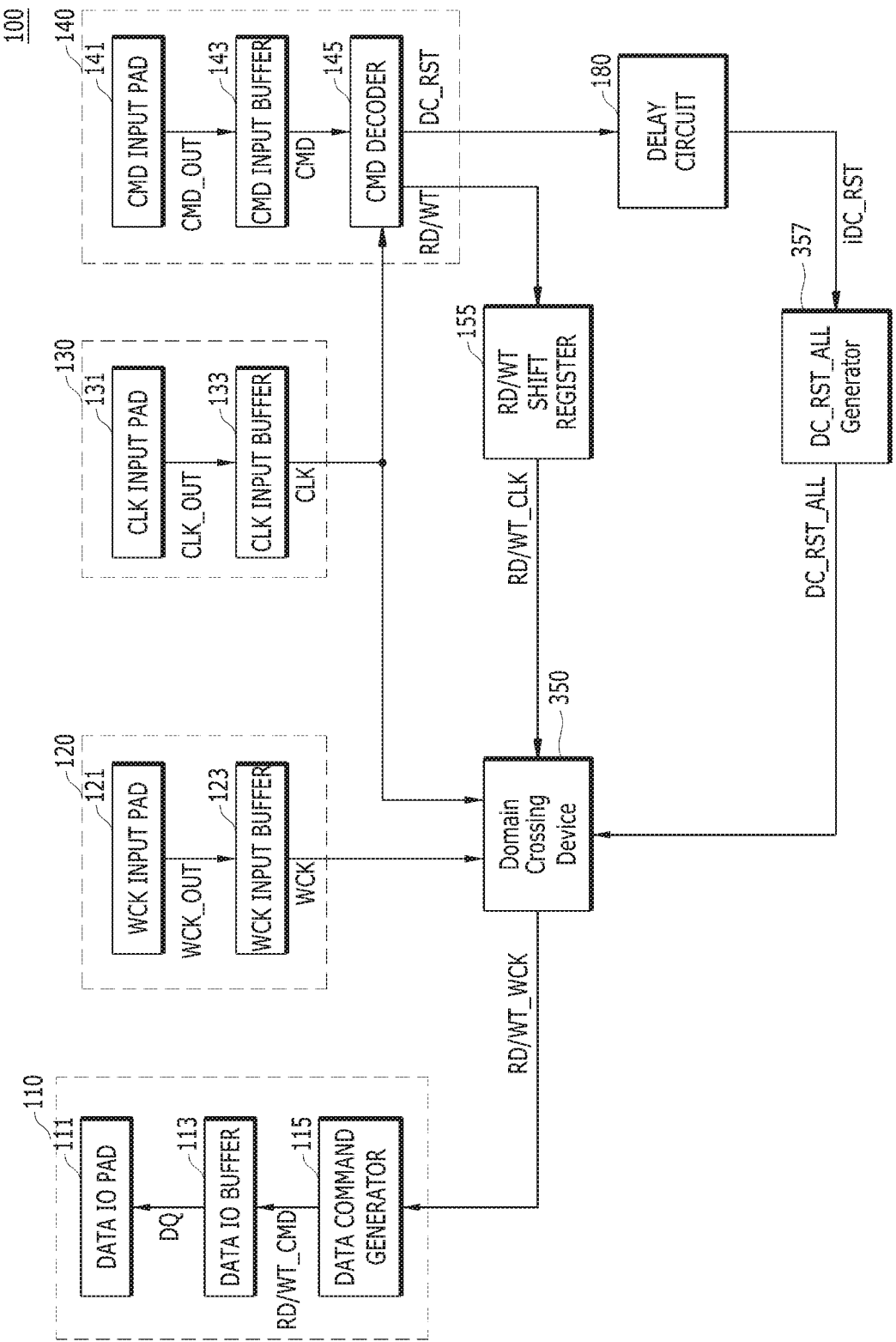
FIG. 3 is a block diagram schematically illustrating a semiconductor memory device in accordance with an embodiment of the present invention.

FIG. 3 is a block diagram schematically illustrating a semiconductor memory device 100 in accordance with an embodiment of the present invention.

Referring to FIG. 3, the semiconductor memory device 100 may include a domain-crossing unit 350 and a whole-domain-crossing-unit-reset-signal generator 357.

In accordance with an embodiment of the present disclosure, the domain-crossing unit 350 may reset both of the counter synchronized to the data clock WCK and the counter synchronized to the system clock CLK, both of the counters synchronized to the data clock WCK and the system clock CLK being included in the domain-crossing unit 350, during the data clock preparation section tWCK_PRE_STATIC.

The whole-domain-crossing-unit-reset-signal generator 357 may include a plurality of D flip-flops coupled to each other. However, the serial D flip-flops is just one embodiment of the whole-domain-crossing-unit-reset-signal generator 357. As described later, any circuit capable of delaying an input signal by an amount of time may comprise the whole-domain-crossing-unit-reset-signal generator 357.

The whole-domain-crossing-unit-reset-signal generator 357 may determine whether to delay the second domaincrossing-unit reset signal iDC_RST by detecting the second domain-crossing-unit reset signal iDC_RST falling in the data clock preparation section tWCK_PRE_STATIC.

When the second domain-crossing-unit reset signal iDC_RST does not fall in the data clock preparation section tWCK_PRE_STATIC, the whole-domain-crossing-unit-reset-signal generator 357 may generate a whole-domain-crossing-unit reset signal DC_RST_ALL by delaying the second domain-crossing-unit reset signal iDC_RST to fall in the data clock preparation section tWCK_PRE_STATIC.

When the second domain-crossing-unit reset signal iDC_RST falls in the data clock preparation section tWCK_PRE_STATIC, the whole-domain-crossing-unit-reset-signal generator 357 may generate the whole-domain-crossing-unit reset signal DC_RST_ALL, which is the same as the second domain-crossing-unit reset signal iDC_RST, without delaying the second domain-crossing-unit reset signal iDC_RST.

When the second domain-crossing-unit reset signal iDC_RST is positioned near starting or ending point of the data clock preparation section tWCK_PRE_STATIC, although the second domain-crossing-unit reset signal iDC_RST falls in the data clock preparation section tWCK_PRE_STATIC, the whole-domain-crossing-unit-reset-signal generator 357 may generate the whole-domain-crossing-unit reset signal DC_RST_ALL positioned at a center of the data clock preparation section tWCK_PRE_STATIC by delaying the second domain-crossing-unit reset signal iDC_RST.

The domain-crossing unit 350 may generate a data-clock-synchronized read/write signal RD/WT_WCK by sampling the data-clock-synchronized read/write signal RD/WT_CLK.

The data command generator 115 may generate the read/write command signal RD/WT_CMD based on the data-clock-synchronized read/write signal RD/WT_WCK, and may output the read/write command signal RD/WT_CMD to the data IO buffer 113.

The data IO buffer 113 outputs the data DQ through the data IO pad 111.

Figure 4:
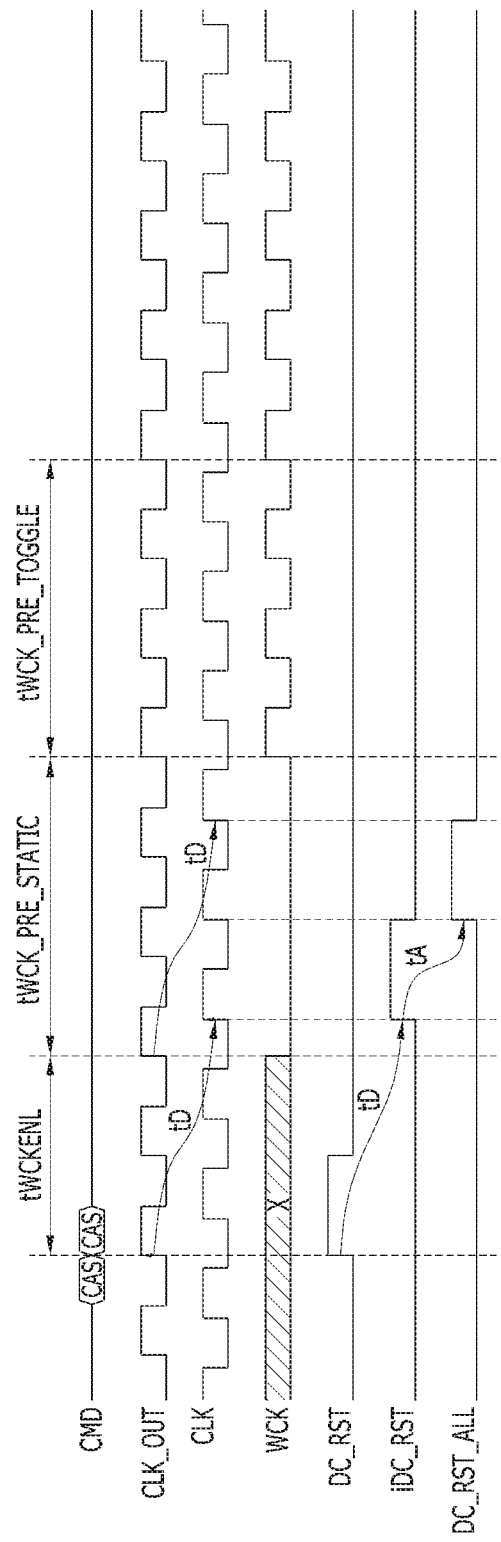
FIG. 4 is a timing diagram illustrating signals of the semiconductor memory device of FIG. 3.

FIG. 4 is a timing diagram illustrating signals of the semiconductor memory device 100 of FIG. 3.

A data-clock-preparation-section-enter section tWCK-ENL may be a time section from when the command input pad 141 of the command input unit 140 receives a command signal CAS to the start point of the data clock preparation section tWCK_PRE_STATIC.

The data clock WCK may have a high logic during the data-clock-preparation-section-enter section tWCKENL, which is marked with "X" in FIG. 4.

A data-clock-pre-toggle section tWCK_PRE_TOGGLE may be a time section for preparation just before the data clock WCK stably toggles.

After the external system clock CLK_OUT is input to the system clock input buffer 133 through the system clock input pad 131, the system clock CLK may be output from the system clock input buffer 133 and input to the domain-crossing unit 350 after an amount of time 'tD'. It may take the amount of time 'tD' for the system clock CLK to propagate from the system clock input buffer 133 to the domain-crossing unit 350.

It is assumed that a time required for the data clock WCK to be input to the domain-crossing unit 350 is ignorable. Therefore, the timings of the data clock WCK and the external system clock CLK_OUT may be the same as each other.

The command decoder 145 may provide the first domain-crossing-unit reset signal DC_RST to Delay Circuit (180). The delay Circuit (180) may provide the second domain-crossing-unit reset signal iDC_RST to the whole-domain-crossing-unit-reset-signal generator 357 by delaying the signal of the first domain-crossing-unit reset signal DC_RST by an amount of 'tD'.

Due to a physical distance from the command decoder 145 to the whole-domain-crossing-unit-reset-signal generator 357, the second domain-crossing-unit reset signal iDC_RST may be generated in the amount of time 'tD' after the first domain-crossing-unit reset signal DC_RST.

Since the second domain-crossing-unit reset signal iDC_RST is synchronized to the system clock CLK, the second domain-crossing-unit reset signal iDC_RST may be used for resetting the counter synchronized to the system clock CLK in the domain-crossing unit 350.

During the data clock preparation section tWCK_PRE_STATIC, the data clock WCK may have a low logic.

Since the data clock WCK does not toggle during the data clock preparation section tWCK_PRE_STATIC, the second domain-crossing-unit reset signal iDC_RST may be used for resetting the counter synchronized to the data clock WCK in the domain-crossing unit 350.

In accordance with an embodiment described with reference to FIG. 4, the second domain-crossing-unit reset signal iDC_RST may fall in the data clock preparation section tWCK_PRE_STATIC.

If required, the whole-domain-crossing-unit-reset-signal generator 357 may generate the whole-domain-crossing-unit reset signal DC_RST_ALL by delaying the second domain-crossing-unit reset signal iDC_RST by an amount of time 'tA' even when the second domain-crossing-unit reset signal iDC_RST falls in the data clock preparation section tWCK_PRE_STATIC.

When the second domain-crossing-unit reset signal iDC_RST does not fall in the data clock preparation section tWCK_PRE_STATIC, the whole-domain-crossing-unit-reset-signal generator 357 may generate the whole-domain-crossing-unit reset signal DC_RST_ALL, which falls in the data clock preparation section tWCK_PRE_STATIC, by delaying the second domain-crossing-unit reset signal iDC_RST by the amount of time 'tA'.

Figure 5:
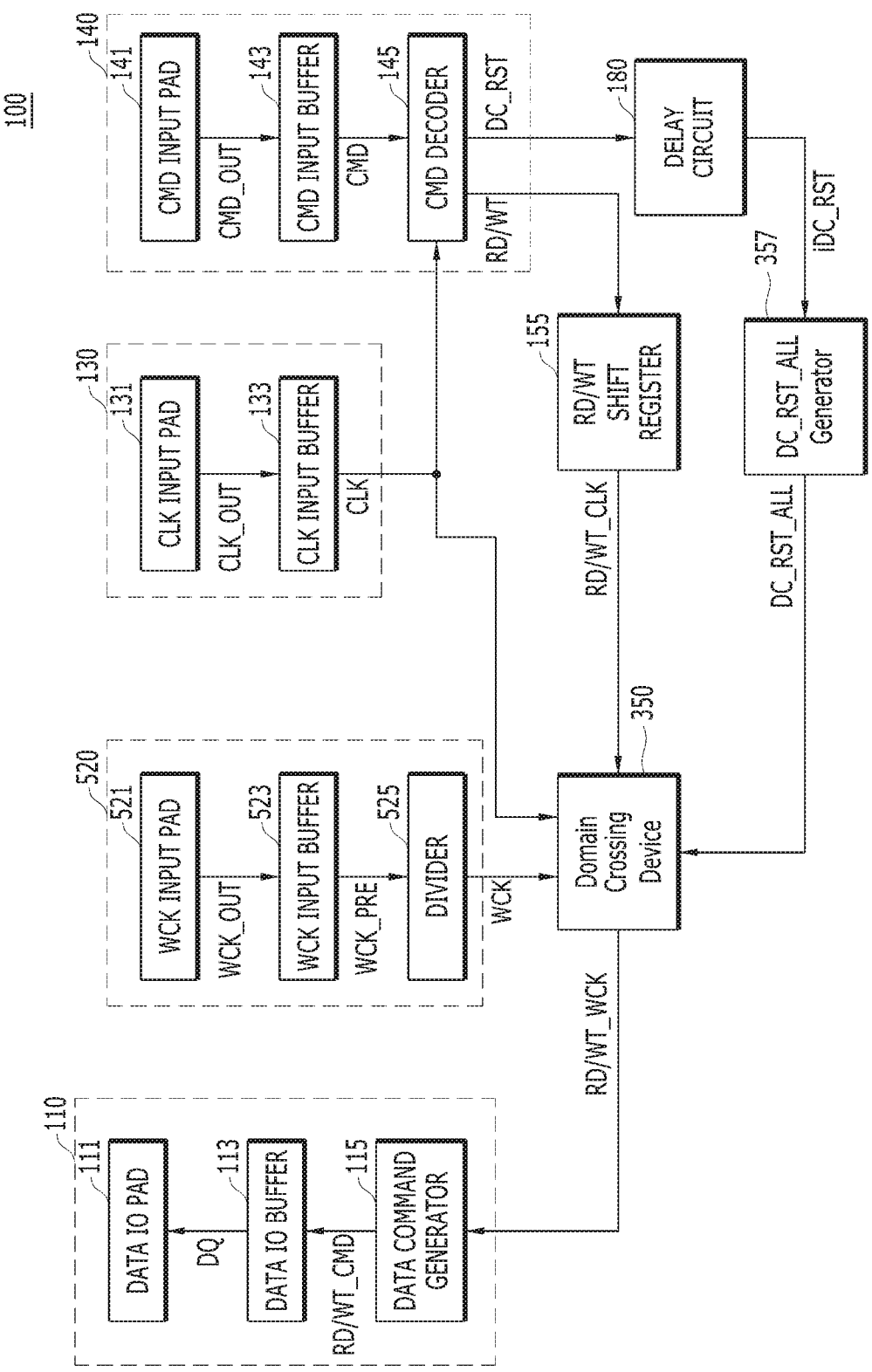
FIG. 5 is a block diagram schematically illustrating a semiconductor memory device in accordance with an embodiment of the present invention.

FIG. 5 is a block diagram schematically illustrating a semiconductor memory device 100 in accordance with an embodiment of the present invention.

Referring to FIG. 5, a data clock input unit 520 of the semiconductor memory device 100 may include a divider 525.

In the above description with reference to FIGS. 3 and 4, it is assumed that the frequencies of the external data clock WCK_OUT and the external system clock CLK_OUT are the same as each other. FIG. 5 illustrates the case where the external data clock WCK_OUT has a higher frequency than the external system clock CLK_OUT.

Referring to FIG. 5, it is assumed that the domain-crossing unit 350 is normally operative when the frequencies of the system clock CLK and the data clock WCK are the same as each other, as described later with reference to FIG. 10A.

However, the above assumption is just an example. The domain-crossing unit 350 may be normally operative according to a frequency ratio between the system clock CLK and the data clock WCK even when the frequencies of the system clock CLK and the data clock WCK are different from each other, as described later with reference to FIG. 10B.

Through a data clock IO pad 521, the data clock input unit 520 may receive an external data clock WCK_OUT provided from an external source. A clock input buffer 523 included in the data clock input unit 520 may generate a pre-data clock WCK_PRE by amplifying the external data clock WCK_OUT.

The divider 525 may generate the data clock WCK based on the pre-data clock WCK_PRE. The divider 525 may generate four signals IWCK, QWCK, IWCKB and QWCKB by dividing the pre-data clock WCK_PRE.

The divided data clocks may be the four signals IWCK, QWCK, IWCKB and QWCKB. The data clock QWCK may be 90-degree shifted from the data clock IWCK, the data clock IWCKB may be 180-degree shifted from the data clock IWCK, and the data clock QWCKB may be 270-degree shifted from the data clock IWCK.

Basically, the data clock WCK output from the divider 525 may be the non-inverted signal IWCK obtained by dividing the pre-data clock WCK_PRE once. The domain-crossing unit 350 may be operative according to the signal IWCK.

The divider 525 may divide the frequency of the data clock WCK to be the same as the frequency of the system clock CLK.

Therefore, the frequencies of the data clock WCK and the system clock CLK may be the same as each other.

Figure 6:
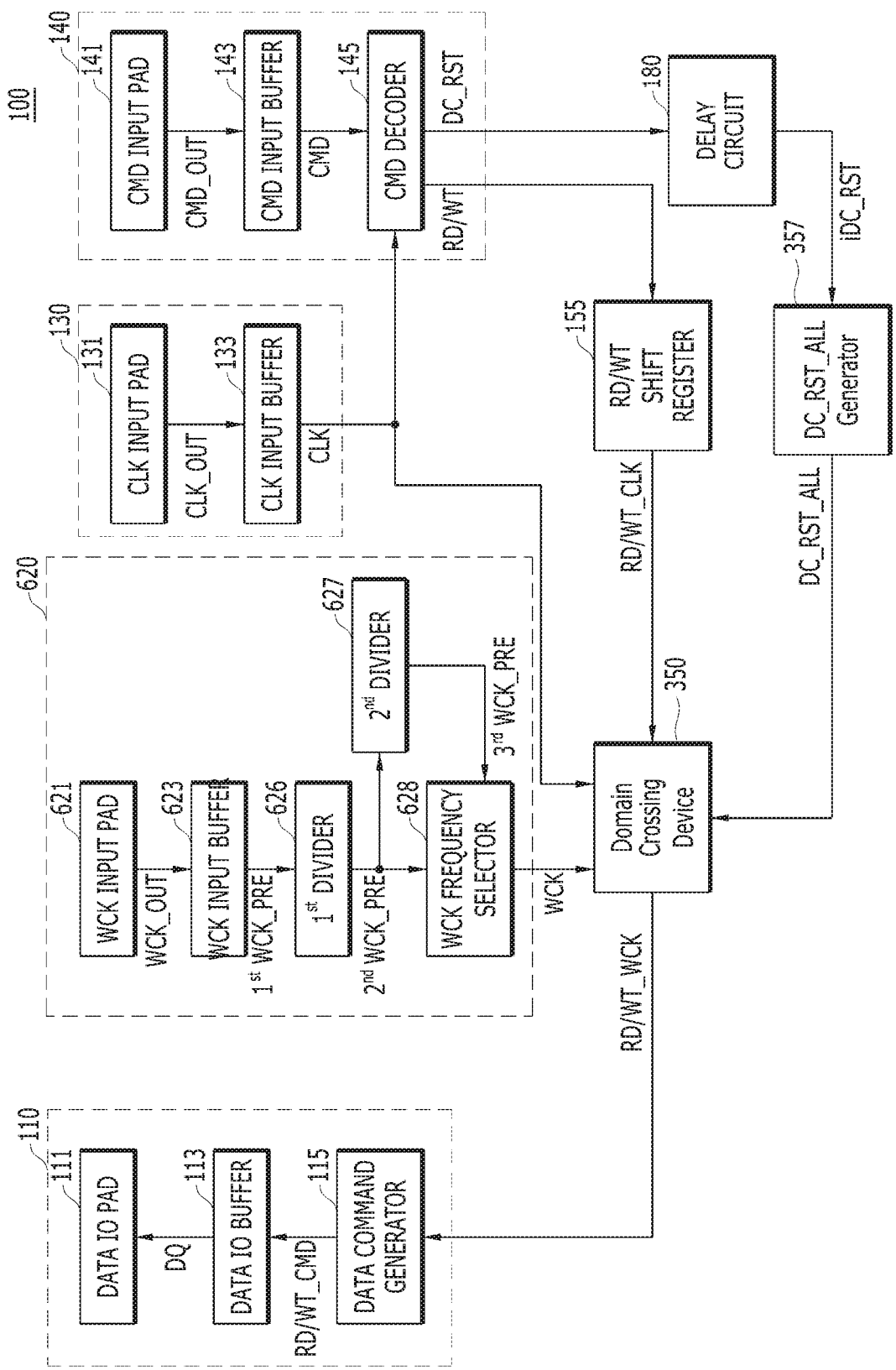
FIG. 6 is a block diagram schematically illustrating a semiconductor memory device in accordance with an embodiment of the present invention.

FIG. 6 is a block diagram schematically illustrating a semiconductor memory device in accordance with an embodiment of the present invention.

Referring to FIG. 6, a data clock input unit 620 of the semiconductor memory device 100 may include a first divider 626, a second divider 627 and a data clock frequency selector 628. The data clock input unit 620 may include all circuits, systems, software, firmware and devices necessary for its operations and functions.

In the above description with reference to FIGS. 3 and 4, it is assumed that the frequencies of the external data clock WCK_OUT and the external system clock CLK_OUT are the same as each other. FIG. 6 illustrates the case where the external data clock WCK_OUT has a higher frequency than the external system clock CLK_OUT.

In the standard of the LPDDR5, it is defined that the external data clock WCK_OUT has a frequency which is twice to four times higher than the external system clock CLK_OUT.

For example, when the external system clock CLK_OUT has a frequency of 800 MHz, the external data clock WCK_OUT may have a frequency of 1600 MHz in the 2:1 mode and a frequency of 3200 MHz in the 4:1 mode.

Referring to FIG. 6, it is assumed that the domain-crossing unit 350 is normally operative when the frequencies of the system clock CLK and the data clock WCK are the same as each other. The domain crossing unit 350 may include all circuits, systems, software, firmware and devices necessary for its operations and functions.

Therefore, the first divider 626, the second divider 627 and the data clock frequency selector 628 may appropriately adjust the frequency of the data clock WCK to be the same as the system clock CLK according to the 2:1 mode and the 4:1 mode, which is based on the assumption that the domain-crossing unit 350 is normally operative according to the system clock CLK and the data clock WCK having the same frequencies as each other.

The first divider 626 may receive a first pre-data clock $1^{st}$ WCK_PRE through a data clock input buffer 623 and may generate a second pre-data clock $2^{nd}$ WCK_PRE by dividing the first pre-data clock $1^{st}$ WCK_PRE once. The second pre-data clock $2^{nd}$ WCK_PRE obtained through dividing the first pre-data clock $1^{st}$ WCK_PRE once may be used in the 2:1 mode.

The second divider 627 may receive the second pre-data clock $2^{nd}$ WCK_PRE and may generate a third pre-data clock $3^{rd}$ WCK_PRE by dividing the second pre-data clock $2^{nd}$ WCK_PRE once again. The third pre-data clock $3^{rd}$ WCK_PRE obtained through dividing the second pre-data clock $2^{nd}$ WCK_PRE once again may be used in the 4:1 mode.

The data clock frequency selector 628 may receive the second pre-data clock $2^{nd}$ WCK_PRE and the third pre-data clock $3^{rd}$ WCK_PRE and select one between the second pre-data clock $2^{nd}$ WCK_PRE and the third pre-data clock $3^{rd}$ WCK_PRE according to the 2:1 mode and the 4:1 mode.

When the domain-crossing unit 350 is operative according to the data clock WCK having a frequency twice greater than the system clock CLK as described with reference to FIG. 10B, the data clock frequency selector 628 may select the second pre-data clock $2^{nd}$ WCK_PRE obtained through dividing the first pre-data clock $1^{st}$ WCK_PRE once even in the 4:1 mode.

Figure 7:
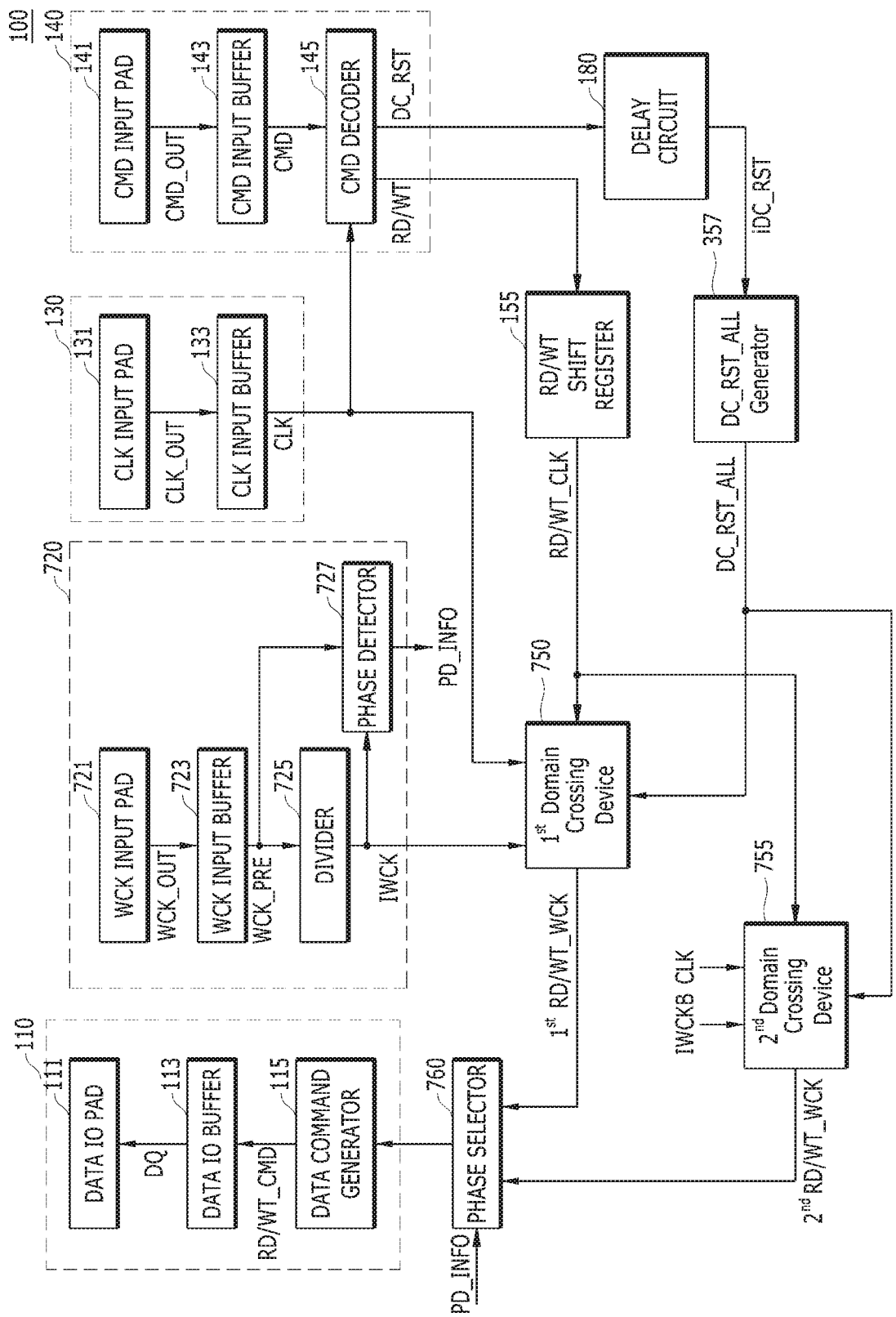
FIG. 7 is a block diagram schematically illustrating a semiconductor memory device in accordance with an embodiment of the present invention.

FIG. 7 is a block diagram schematically illustrating a semiconductor memory device in accordance with an embodiment of the present invention.

Referring to FIG. 7, the semiconductor memory device 100 may include a plurality of domain-crossing units, for example a first domain-crossing unit 750 and a second domain-crossing unit 755. The first domain crossing unit 750 and the second domain-crossing unit 755 may include all circuits, systems, software, firmware and devices necessary for their respective operations and functions.

The first domain-crossing unit 750 and the second domain-crossing unit 755 may be included in respective single domain-crossing units of a higher structural level. For example, the first domain-crossing unit 750 and the second domain-crossing unit 755 may be sub domain-crossing units of the respective single domain-crossing units of a higher structural level.

While the divider 725 is dividing the pre-data clock WCK_PRE, the four signals IWCK, QWCK, IWCKB and QWCKB may not be normally output due to a malfunction of the divider 725. For example, the non-inverted signal IWCK may not be output and the inverted signal IWCK may be output to have the same phase as the non-inverted signal IWCKB.

In order to prevent the above described situation, the semiconductor memory device 100 may include the plurality of domain-crossing units, for example the first domain-crossing unit 750 and the second domain-crossing unit 755.

The semiconductor memory device 100 may further include a phase detector 727 configured to detect whether or not the divided four signals IWCK, QWCK, IWCKB and QWCKB are output to have the non-inverted phase.

The phase detector 727 may determine whether or not the data clock IWCK has a non-inverted phase by comparing the data clock IWCK with the pre-data clock WCK_PRE.

When there is no phase difference between the data clock IWCK and the pre-data clock WCK_PRE since the divider 725 normally operates, the phase detector 727 may output a phase detection information signal PD_INFO having a high logic.

When there is a phase difference between the data clock IWCK and the pre-data clock WCK_PRE since the divider 725 does not normally operate, the phase detector 727 may output the phase detection information signal PD_INFO having a low logic.

The operation of the first domain-crossing unit 750 may be the same as described above. The second domain-crossing unit 755 may receive the data clock IWCKB of the inverted phase and may generate a second data-clock-synchronized read/write signal $2^{nd}$ RD/WT_WCK synchronized to the data clock IWCKB of the inverted phase.

The semiconductor memory device 100 may further include a phase selector 760 configured to select one among the first data-clock-synchronized read/write signal $1^{st}$ RD/WT_WCK and the second data-clock-synchronized read/write signal $2^{nd}$ RD/WT_WCK output from the first domain-crossing unit 750 and the second domain-crossing unit 755, respectively.

The phase selector 760 may receive the first data-clock-synchronized read/write signal $1^{st}$ RD/WT_WCK of the non-inverted phase, the second data-clock-synchronized read/write signal $2^{nd}$ RD/WT_WCK of the inverted phase and the phase detection information signal PD_INFO.

When the phase detection information signal PD_INFO has a high logic, the phase selector 760 is configured to select and output the first data-clock-synchronized read/write signal $1^{st}$ RD/WT_WCK of the non-inverted phase.

When the phase detection information signal PD_INFO has a low logic, the phase selector 760 is configured to select and output the second data-clock-synchronized read/write signal $2^{nd}$ RD/WT_WCK of the inverted phase.

As illustrated in FIG. 7, the semiconductor memory device 100 may include the plurality of domain-crossing units and thus may prevent the malfunction risk of the divider.

Figure 8:
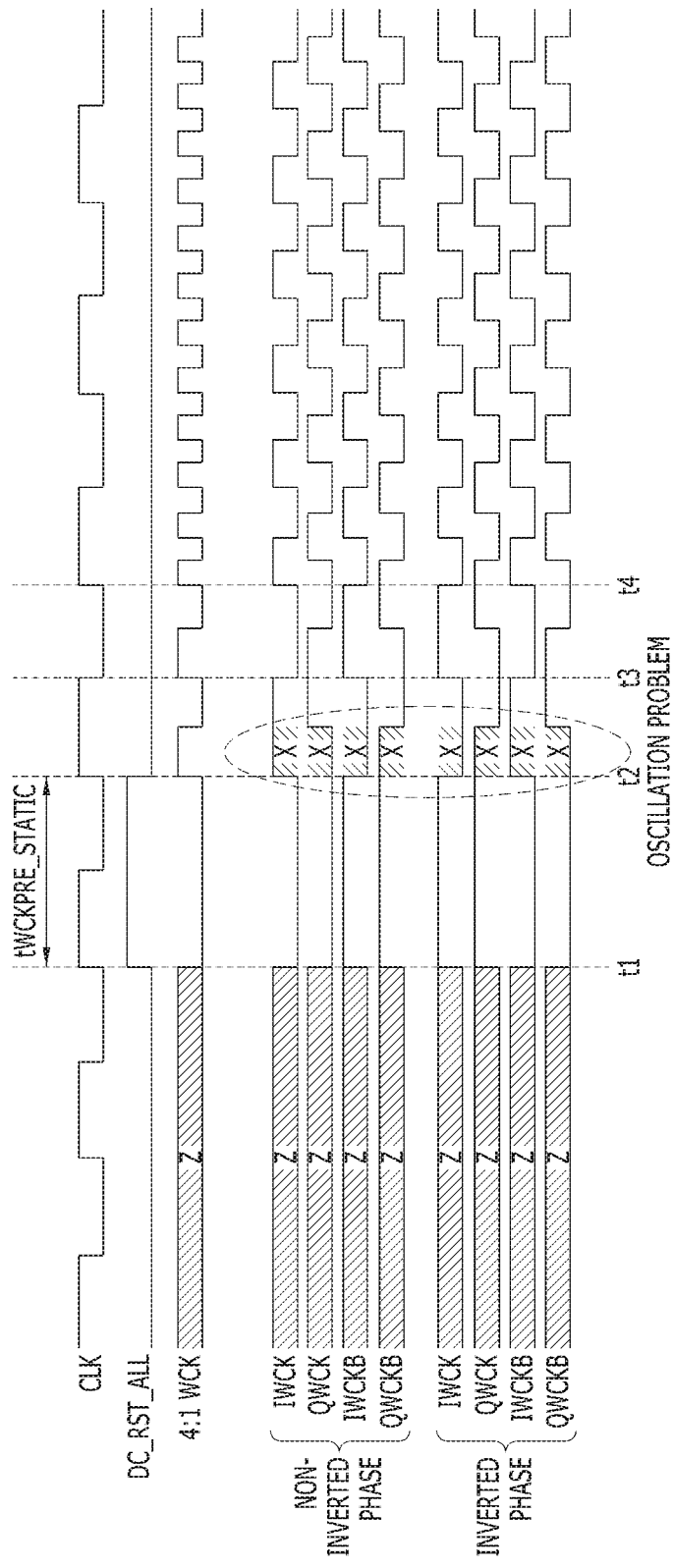
FIG. 8 is a timing diagram illustrating signals of a semiconductor memory device which indicate a malfunction of a divider.

FIG. 8 is a timing diagram illustrating signals of a semiconductor memory device for indicating a malfunction of a divider.

Figure 10A:
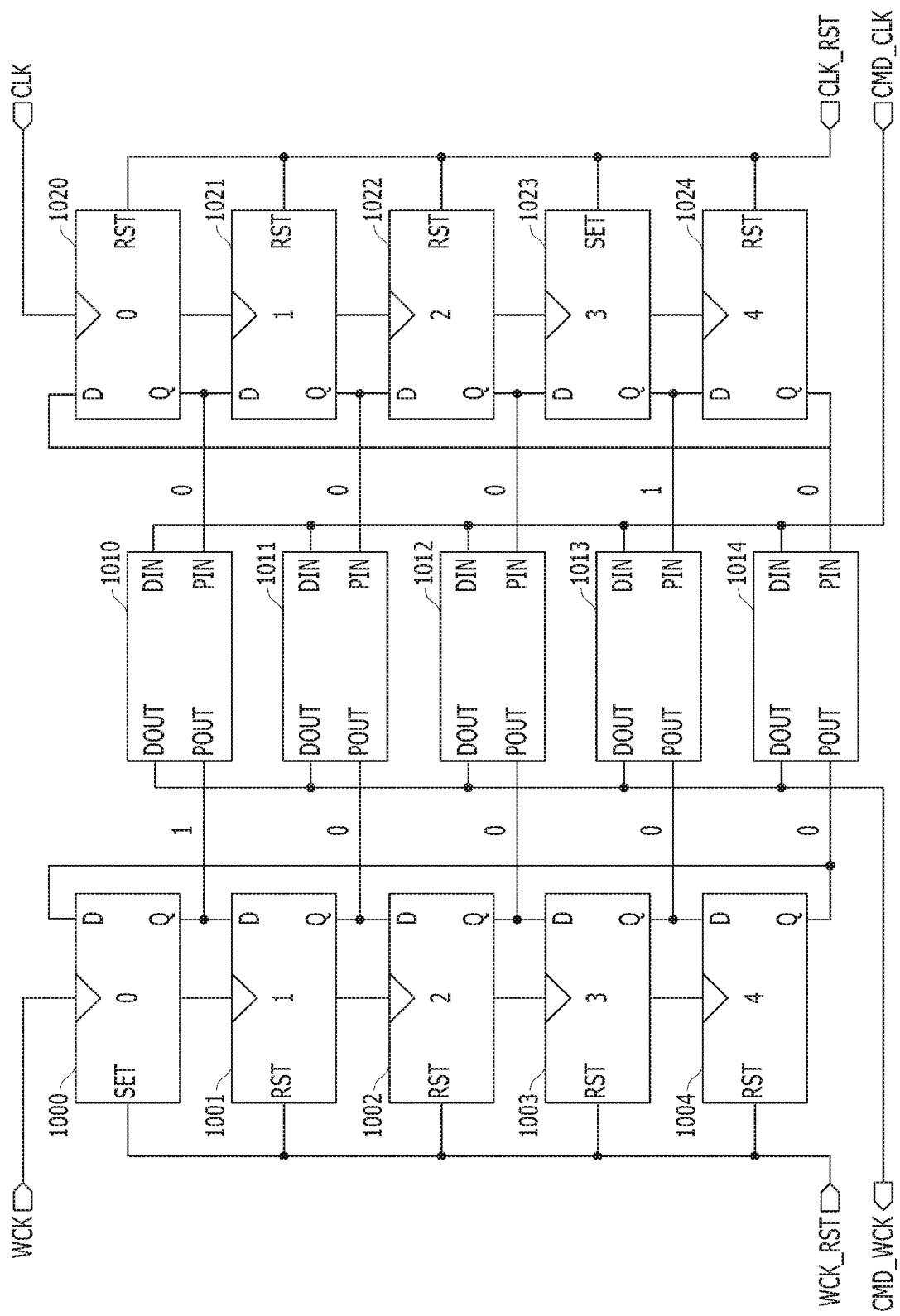
FIG. 10A is a circuit diagram illustrating a domain crossing unit operative according to a system clock and a data clock having the same frequency as each other.
Figure 10B:
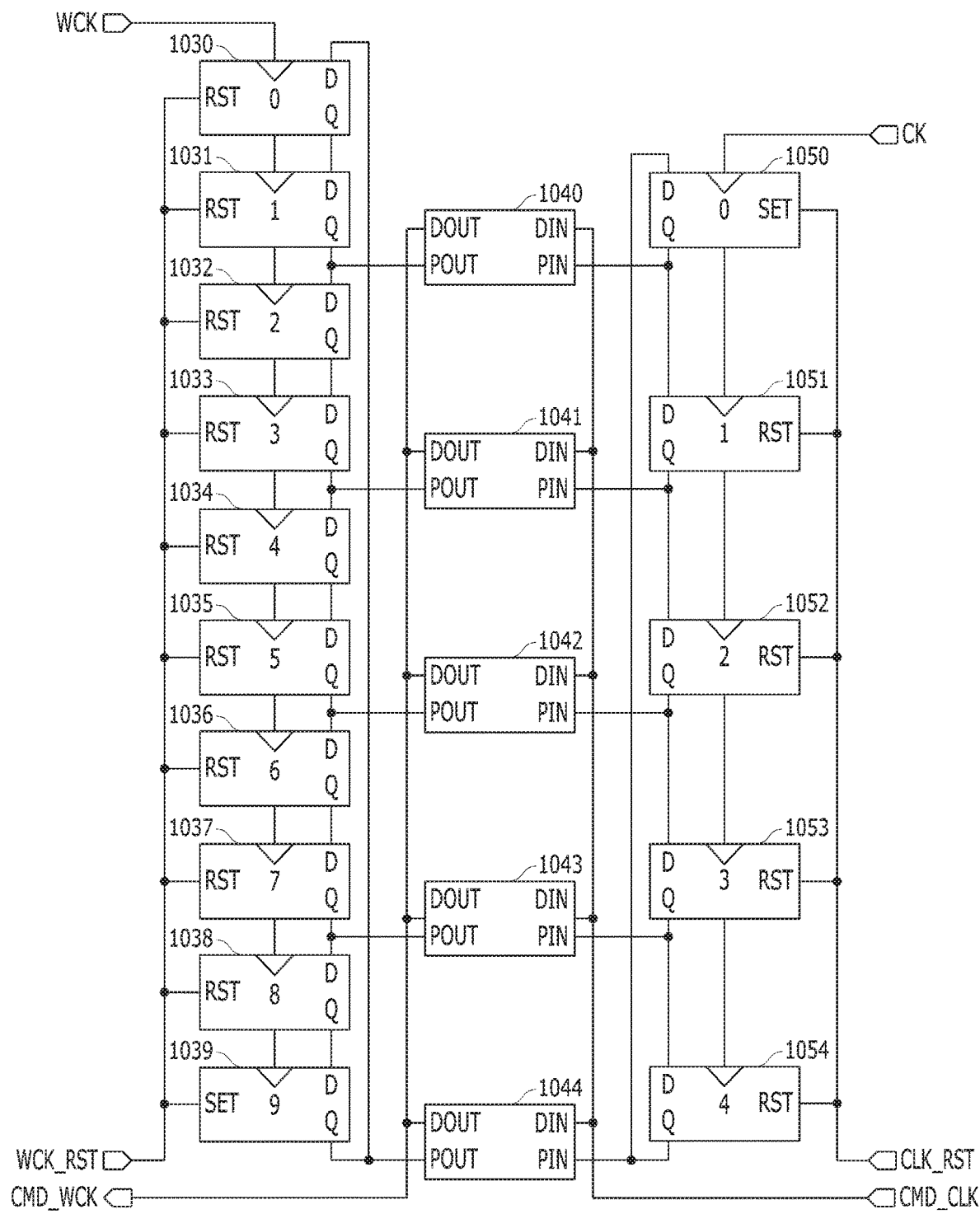
FIG. 10B is a circuit diagram illustrating a domain crossing unit operative according to a system clock and a data clock having a frequency twice greater than the system clock.

It is assumed that the domain-crossing unit in accordance with an embodiment of the present disclosure is operative according to the data clock WCK having a frequency which is twice greater than the system clock CLK, as illustrated in FIG. 10B. Referring to FIG. 8, the frequency ratio between the data clock IWCK divided to have the non-inverted phase and the system clock CLK may be 2:1 at a time point 't4'.

The divided data clocks having the non-inverted phases may be signals IWCK, QWCK, IWCKB and QWCKB. The divided data clocks having the inverted phases may also be signals IWCK, QWCK, IWCKB, QWCKB.

Basically, the domain-crossing unit may be operative according to the signal IWCK, which is the most basic signal.

The data clock QWCK may be 90-degree shifted from the data clock IWCK, the data clock IWCKB may be 180-degree shifted from the data clock IWCK, and the data clock QWCKB may be 270-degree shifted from the data clock IWCK.

For normal operation of the semiconductor memory device as well as the domain-crossing unit, the data clock IWCK of the non-inverted phase should rise at the rising edge of the system clock CLK with reference to the time point 't4'.

During the time section between the time points 't2' and 't3', the divided data clocks IWCK, QWCK, IWCKB, QWCKB may be generated to have the inverted phase due to the malfunction of the divider.

The divided data clock IWCK of the inverted phase may fall at the time point 't4' since the divided data clock IWCK of the inverted phase may fall at the time point 't2'.

Therefore, when the divided data clocks IWCK, QWCK, IWCKB and QWCKB having the non-inverted phase are not generated while the divided data clocks IWCK, QWCK, IWCKB and QWCKB having the inverted phase are generated, the domain-crossing unit, which is supposed to operate according to the data clock IWCK having the non-inverted phase, may not normally operate.

Referring to FIG. 8, the waveform of the data clock IWCK having the non-inverted phase may be the same as the data clock IWCKB having the inverted phase shifted by the 180 degrees from the data clock IWCK having the non-inverted phase.

In accordance with an embodiment described with reference to FIG. 7, the phase detector 727 may generate the phase detection information signal PD_INFO by detecting the divided data clocks IWCK, QWCK, IWCKB and QWCKB having the inverted phase.

The first domain-crossing unit 750 may be operative according to the data clock IWCK having the non-inverted phase. The second domain-crossing unit 755 may be operative according to the data clock IWCKB having the inverted phase shifted by the 180 degrees from the data clock IWCK having the inverted phase.

When the data clock WCK is divided to generate the divided data clocks having the non-inverted phase, the first domain-crossing unit 750 may be normally operative while the second domain-crossing unit 755 may not be normally operative.

When the data clock WCK is divided to generate the divided data clocks having the inverted phase, the first domain-crossing unit 750 may not be normally operative while the second domain-crossing unit 755 may be normally operative.

When the data clock WCK is determined as divided to generate the divided data clocks having the non-inverted phase according to the phase detection information signal PD_INFO, the phase detector 760 may output the first data-clock-synchronized read/write signal $1^{st}$ RD/WT_WCK generated by the first domain-crossing unit 750.

When the data clock WCK is determined as divided to generate the divided data clocks having the inverted phase according to the phase detection information signal PD_INFO, the phase detector 760 may output the second data-clock-synchronized read/write signal $2^{nd}$ RD/WT_WCK generated by the second domain-crossing unit 755.

Figure 9A:
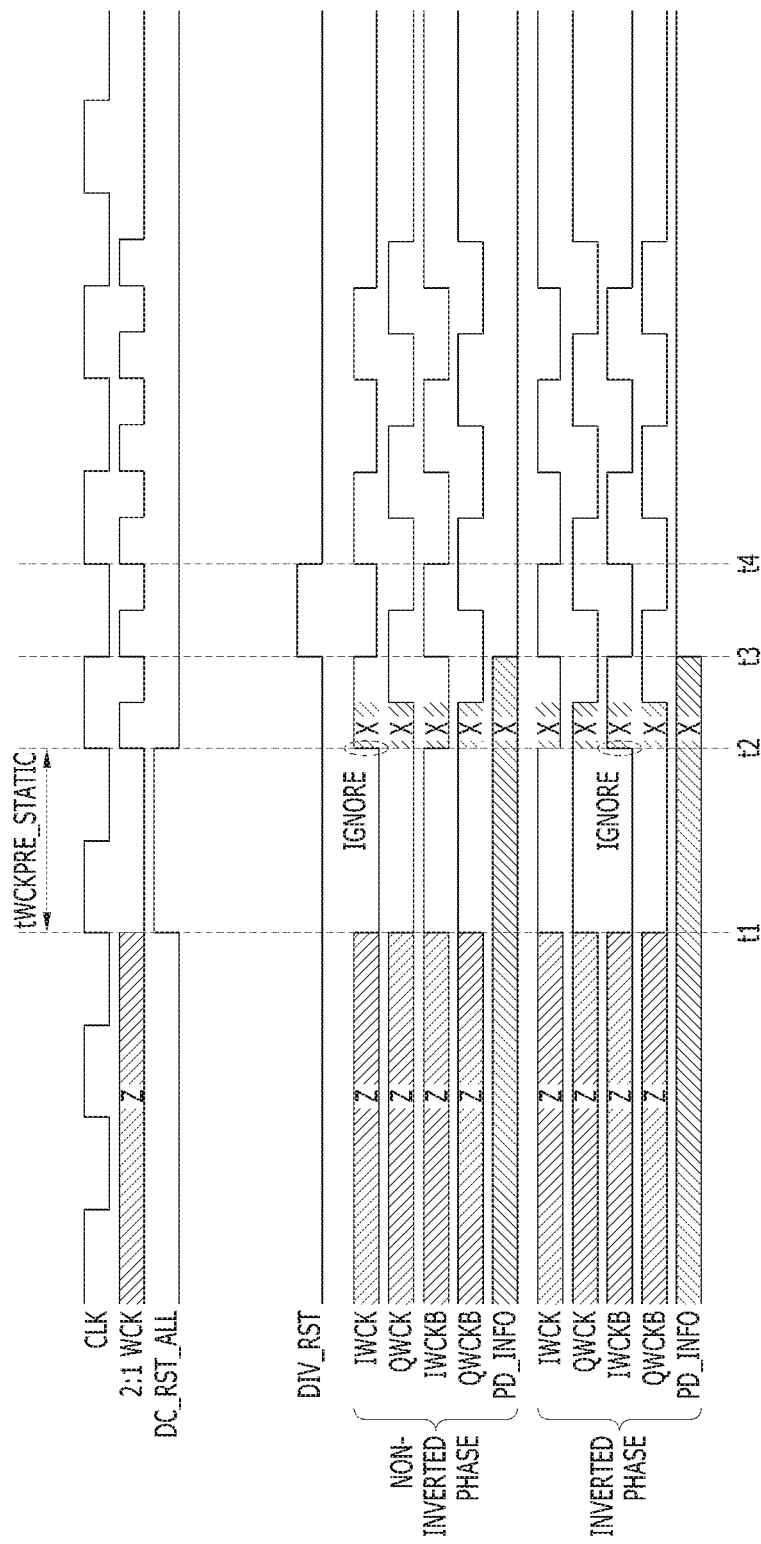
FIGS. 9A and 9B are timing diagrams illustrating signals of a semiconductor memory device further including a divider reset signal for a malfunction of a divider.
Figure 9B:
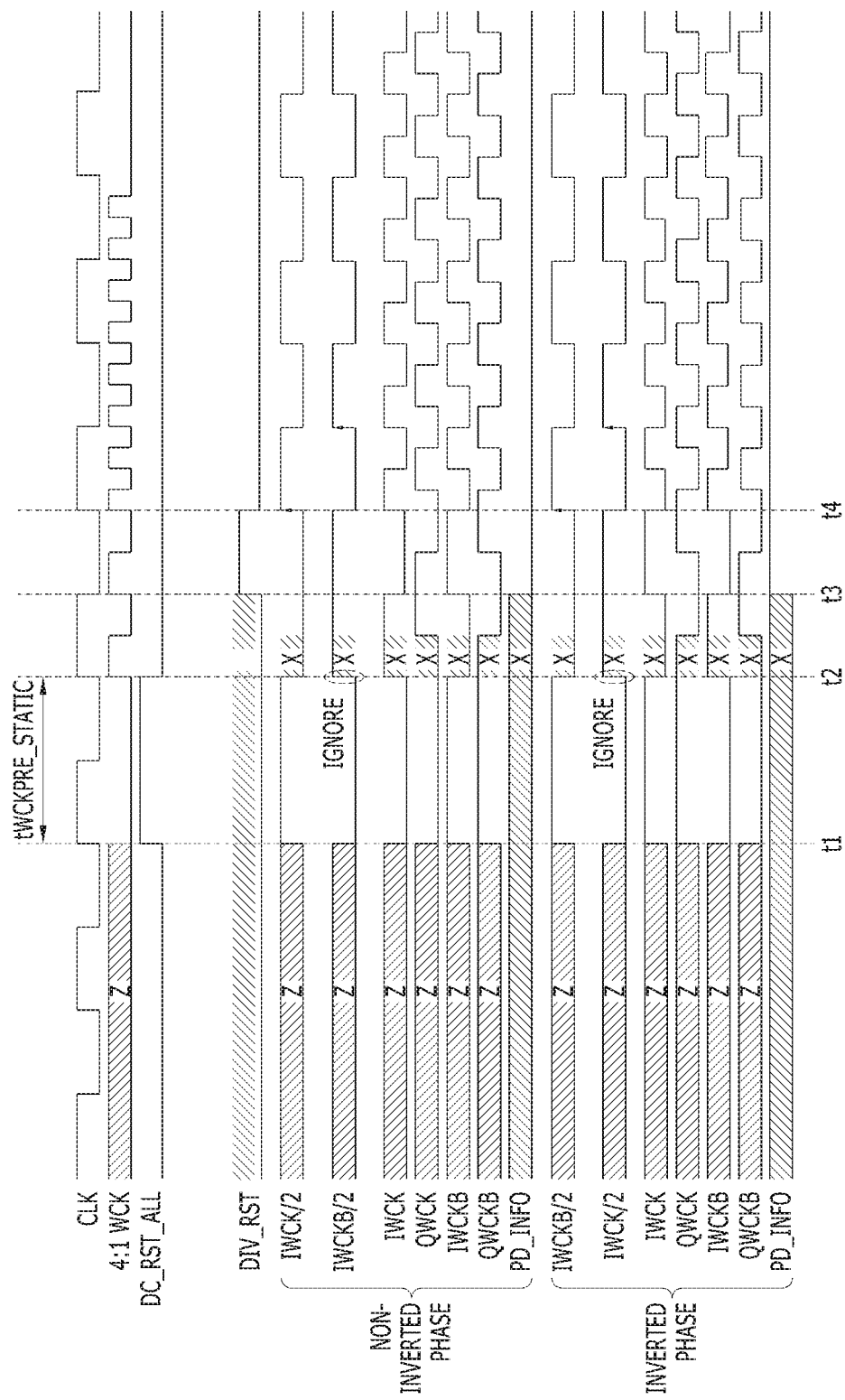

FIGS. 9A and 9B are timing diagrams illustrating signals of the semiconductor memory device 100 further including a divider reset signal DIV_RST for a malfunction of a divider.

FIG. 9A illustrates a timing diagram illustrating signals of the semiconductor memory device 100 when the semiconductor memory device 100 resets the first divider 626 mode to prevent the case where the first divider 626 malfunctions in the 2:1.

The divider reset signal DIV_RST may be generated by delaying an existing signal, for example, the whole-domain-crossing-unit reset signal DC_RST_ALL. In an embodiment, the divider reset signal DIV_RST may be newly generated.

During the time section between the time points 't2' and 't3' after the domain-crossing unit is reset during the time section between the time points 't1' and 't2', the first divider 626 may malfunction.

When the first divider 626 malfunctions, the data clock IWCK of the non-inverted phase or the data clock IWCKB of the inverted phase may not rise at the time point 't4'.

To prevent the above described situation, the first divider 626 may be reset to have a low logic by the divider reset signal DIV_RST at the time point 't3' so that the data clock IWCK of the non-inverted phase or the data clock IWCKB of the inverted phase rise at the time point 't4'.

Therefore, in accordance with an embodiment of the present disclosure, the semiconductor memory device 100 may normally operate despite the malfunction of the first divider 626.

FIG. 9B illustrates a timing diagram illustrating signals of the semiconductor memory device 100 when the semiconductor memory device 100 resets the second divider 627 mode to prevent the case where the second divider 627 malfunctions in the 4:1.

Referring to FIG. 9B, the data clock IWCK/2 may be divided from the data clock IWCK and the data clock IWCKB/2 may be divided from the data clock IWCKB.

During the time section between the time points 't2' and 't3' after the domain-crossing unit is reset during the time section between the time points 't1' and 't2', the second divider 627 may malfunction.

When the second divider 627 malfunctions, the data clock IWCK/2 of the non-inverted phase or the data clock IWCKB/2 of the inverted phase may not rise at the time point 't4'.

To prevent the above described situation, the second divider 627 may be reset to have a low logic by the divider reset signal DIV_RST at the time point 't3' so that the data clock IWCK/2 of the non-inverted phase or the data clock IWCKB/2 of the inverted phase rise at the time point 't4'.

Therefore, in accordance with an embodiment of the present disclosure, the semiconductor memory device 100 may normally operate despite the malfunction of the second divider 627.

FIG. 10A is a circuit diagram illustrating a domain crossing unit operative according to the system clock CLK and the data clock WCK having the same frequency as each other.

In accordance with an embodiment of the present disclosure, the domain-crossing unit may operate in the ring counter basis.

In accordance with an embodiment of the present disclosure, the domain-crossing unit may include five D flip flops 1000 to 1004 coupled to the data clock WCK, five pipe units 1010 to 1014, and five D flip flops 1020 to 1024 coupled to the system clock CLK.

The five D flip flops 1000 to 1004 coupled to the data clock WCK may be operative according the data clock WCK. The five D flip flops 1020 to 1024 coupled to the system clock CLK may be operative according to the system clock CLK.

The five D flip flops 1020 to 1024 coupled to the system clock CLK may sequentially select the five pipe units 1010 to 1014 through 'PIN'.

The five D flip flops 1020 to 1024 coupled to the system clock CLK may store a system clock synchronization command CMD_CLK into the selected one among the five pipe units 1010 to 1014 through 'DIN'.

The five D flip flops 1000 to 1004 coupled to the data clock WCK may sequentially select the five pipe units 1010 to 1014 through 'POUT'.

The five D flip flops 1000 to 1004 coupled to the data clock WCK may output as a data clock synchronization command CMD_WCK the system clock synchronization command CMD_CLK from the selected one among the five pipe units 1010 to 1014 through 'DOUT'.

As illustrated in FIG. 10A, the D flip flop 1023 may be set and the D flip flop 1023 may operate first among the five D flip flops 1020 to 1024 coupled to the system clock CLK.

When the D flip flop 1023 selects the pipe unit 1013, the D flip flop 1023 may store the system clock synchronization command CMD_CLK into the pipe unit 1013. The D flip flop 1024 may operate after the D flip flop 1023. When the D flip flop 1024 selects the pipe unit 1014, the D flip flop 1024 may store the system clock synchronization command CMD_CLK into the pipe unit 1014. The D flip flop 1020 may operate after the D flip flop 1024. When the D flip flop 1020 selects the pipe unit 1010, the D flip flop 1020 may store the system clock synchronization command CMD_CLK into the pipe unit 1010.

In the similar way, the five D flip flops 1020 to 1024 coupled to the system clock CLK may operate in the rotary manner according to the ring counter basis.

The five pipe units 1010 to 1014 coupled respectively through 'PIN' to the five D flip flops 1020 to 1024 coupled to the system clock CLK may store the system clock synchronization command CMD_CLK by the five D flip flops 1020 to 1024 coupled to the system clock CLK.

In the similar way, the five D flip flops 1000 to 1004 coupled to the data clock WCK may operate in the rotary manner starting from the D flip flop 1000 according to the ring counter basis.

As illustrated in FIG. 10A, the D flip flop 1000 may be set and the D flip flop 1000 may operate first among the five D flip flops 1000 to 1004 coupled to the data clock WCK.

When the D flip flop 1000 selects the pipe unit 1010, the system clock synchronization command CMD_CLK may be output as the data clock synchronization command CMD_WCK from the pipe unit 1010 through the 'DOUT'.

The D flip flop 1001 may operate after the D flip flop 1000. When the D flip flop 1001 selects the pipe unit 1011, the system clock synchronization command CMD_CLK may be output as the data clock synchronization command CMD_WCK from the pipe unit 1011 through the 'DOUT'.

In accordance with an embodiment of the present disclosure, 3 periods after the system clock synchronization command CMD_CLK is stored in the pipe unit 1013 by the D flip flop 1023, the system clock synchronization command CMD_CLK may be output as the data clock synchronization command CMD_WCK from the pipe unit 1013 by the D flip flop 1003.

As illustrated in FIG. 10A, the domain-crossing unit may change the system clock synchronization command CMD_CLK into the data clock synchronization command CMD_WCK through 3 times of sampling.

As described above, by adjusting the start point of the operation of the D flip flop, which is set, the number of sampling may be controlled. For example, when the D flip flops 1000 and 1024 are set, the domain-crossing unit may operate the synchronization operation through 4 times of the sampling.

In general, the domain-crossing unit is evaluated to perform a more precise synchronization operation as the number of the sampling becomes greater. However, it takes greater time to perform the synchronization operation as the number of the sampling becomes greater. Therefore, the operation performance of the domain-crossing unit may be adjusted by controlling the number of the sampling.

As described with reference to FIG. 3, the domain-crossing unit 350 may generate the data-clock-synchronized read/write signal RD/WT_WCK, which is synchronized to the data clock WCK by sampling the system-clock-synchronized read/write signal RD/WT_CLK.

FIG. 10B is a circuit diagram illustrating a domain crossing unit operative according to the system clock CLK and the data clock WCK having a frequency twice greater than the system clock CLK.

In accordance with an embodiment of the present disclosure, the domain-crossing unit may include ten D flip flops 1030 to 1039 coupled to the data clock WCK, five pipe units 1040 to 1044, and five D flip flops 1050 to 1054 coupled to the system clock CLK.

Since the data clock WCK has a frequency twice greater than the system clock CLK, two among the ten D flip flops 1030 to 1039 coupled to the data clock WCK may operate while one among the five D flip flops 1050 to 1054 coupled to the system clock CLK operates.

For example, the D flip flop 1039 and the D flip flop 1030 may operate while the D flip flop 1050 operates.

As described above, a ratio in numbers of operating D flip flops may be controlled according to a ratio in frequencies of the data clock WCK and the system clock CLK. Therefore, the domain-crossing unit may be operative according to the data clock WCK and the system clock CLK having different frequencies from each other.

While the present invention has been described with respect to the specific embodiments, it will be apparent to those skilled in the art that various changes and modifications may be made without departing from the spirit and scope of the invention as defined in the following claims.

What is claimed is:

1. An operating method for a semiconductor memory device, the method comprising:
   generating a domain-crossing-unit reset signal synchronized with a system clock;
   generating a whole-domain-crossing-unit reset signal based on the domain-crossing-unit reset signal input to a whole-domain-crossing-unit-reset-signal generator; and
   resetting a data-clock-counter synchronized with a data clock of a domain-crossing unit based on the whole-domain-crossing-unit reset signal during a data clock preparation section in which the data clock does not toggle, and a system-clock-counter synchronized with the system clock based on the domain-crossing-unit reset signal.

2. The method of claim 1, wherein the generating of the whole-domain-crossing-unit reset signal includes generating the whole-domain-crossing-unit reset signal, which is the same as the domain-crossing-unit reset signal, when the domain-crossing-unit reset signal falls in the data clock preparation section.

3. The method of claim 2, wherein the generating of the whole-domain-crossing-unit reset signal includes generating the whole-domain-crossing-unit reset signal, which falls in the data clock preparation section, by delaying the domain-crossing-unit reset signal by a predetermined amount of time when the domain-crossing-unit reset signal does not fall in the data clock preparation section.

4. The method of claim 3, further comprising generating a data clock by dividing a pre-data clock signal output from a data clock input buffer.

5. The method of claim 4, wherein the generating of the data clock includes dividing the pre-data clock signal based on a ratio of frequencies of the data clock and the system clock so that frequencies of the data clock and the system clock are the same as each other.

6. The method of claim 4, wherein the generating of the data clock includes:

a first step of generating a second pre-data clock signal by dividing the pre-data clock signal through a first divider;
a second step of generating a third pre-data clock signal by dividing the second pre-data clock signal through a second divider; and
a third step of generating the data clock by selecting one between the second pre-data clock signal and the third pre-data clock signal.

7. The method of claim 6, wherein the third step generates the data clock by selecting the data clock signal having the same frequency as the system clock based on a ratio of frequencies of the data clock and the system clock.

8. The method of claim 5, further comprising:
   generating a first data-clock-synchronized read/write signal based on a data clock having a non-inverted phase; and
   generating a second data-clock-synchronized read/write signal based on a data clock having an inverted phase.

9. The method of claim 8, further comprising generating, by a phase detector, a phase detection information signal representing phase information of the data clock based on the pre-data clock.

10. The method of claim 9, further comprising selecting and outputting, by a phase selector, one between the first data-clock-synchronized read/write signal and the second data-clock-synchronized read/write signal based on the phase detection information signal.

11. A semiconductor memory device comprising:
   a command decoder suitable for generating a domain-crossing-unit reset signal synchronized with a system clock;
   a domain-crossing unit; and
   a whole-domain-crossing-unit-reset-signal generator suitable for generating a whole-domain-crossing-unit reset signal based on the domain-crossing-unit reset signal,
   wherein the domain-crossing unit resets a data-clock-counter synchronized with a data clock of the domain-crossing unit based on the whole-domain-crossing-unit reset signal during a data clock preparation section in which the data clock does not toggle, and
   wherein the domain-crossing unit resets a system-clock-counter synchronized with the system clock based on the domain-crossing-unit reset signal.

12. The semiconductor memory device of claim 11, wherein the whole-domain-crossing-unit-reset-signal generator generates the whole-domain-crossing-unit reset signal, which is the same as the domain-crossing-unit reset signal, when the domain-crossing-unit reset signal falls in the data clock preparation section.

13. The semiconductor memory device of claim 12, wherein the whole-domain-crossing-unit-reset-signal generator generates the whole-domain-crossing-unit reset signal, which falls in the data clock preparation section, by delaying the domain-crossing-unit reset signal by a predetermined amount of time when the domain-crossing-unit reset signal does not fall in the data clock preparation section.

14. The semiconductor memory device of claim 13, further comprising a divider suitable for generating a data clock by dividing a pre-data clock signal output from a data clock input buffer.

15. The semiconductor memory device of claim 14, wherein the divider divides the pre-data clock signal based on a ratio of frequencies of the data clock and the system clock so that frequencies of the data clock and the system clock are the same as each other.

16. The semiconductor memory device of claim 14, wherein the divider includes:
- a first divider suitable for generating a second pre-data clock signal by dividing the pre-data clock signal through a first divider;
- a second divider suitable for generating a third pre-data clock signal by dividing the second pre-data clock signal through a second divider; and
- a data clock frequency selector suitable for generating the data clock by selecting one between the second pre-data clock signal and the third pre-data clock signal.

17. The semiconductor memory device of claim 16, wherein the data clock frequency selector generates the data clock by selecting the data clock signal having the same frequency as the system clock based on a ratio of frequencies of the data clock and the system clock.

18. The semiconductor memory device of claim 15, wherein the domain-crossing unit includes:
- a first domain-crossing unit suitable for generating a first data-clock-synchronized read/write signal based on a data clock having a non-inverted phase; and
- a second domain-crossing unit suitable for generating a second data-clock-synchronized read/write signal based on a data clock having an inverted phase.

19. The semiconductor memory device of claim 18, further comprising a phase detector suitable for generating a phase detection information signal representing phase information of the data clock based on the pre-data clock.

20. The semiconductor memory device of claim 19, further comprising a phase selector suitable for selecting and outputting one of the first data-clock-synchronized read/write signal and the second data-clock-synchronized read/write signal based on the phase detection information signal.

* * * * *